United States Patent
Murray et al.

(10) Patent No.: US 7,280,808 B2
(45) Date of Patent: Oct. 9, 2007

(54) WIRELESS COMMUNICATIONS DEVICES INCLUDING CIRCUIT SUBSTRATES WITH PARTIALLY OVERLAPPING CONDUCTORS THEREON COUPLING POWER TO/FROM POWER AMPLIFIER SYSTEMS

(75) Inventors: Matthew J. Murray, Raleigh, NC (US); Michael D. Townsend, Durham, NC (US); Christian L. Lindqvist, Chapel Hill, NC (US); Michael O. Wayland, Elon, NC (US)

(73) Assignee: Sony Ericsson Mobile Communications, AB, Lund (SE)

( * ) Notice: Subject to any disclaimer, the term of this patent is extended or adjusted under 35 U.S.C. 154(b) by 369 days.

(21) Appl. No.: 10/822,377

(22) Filed: Apr. 12, 2004

(65) Prior Publication Data

US 2005/0227665 A1    Oct. 13, 2005

(51) Int. Cl.
*H04B 1/04* (2006.01)

(52) U.S. Cl. ............... 455/114.2; 455/63.1; 455/127.1; 174/261

(58) Field of Classification Search ............. 455/114.2, 455/127.1, 63.1, 296, 298, 300, 310; 330/66, 330/18, 277; 174/261
See application file for complete search history.

(56) References Cited

U.S. PATENT DOCUMENTS

| | | | |
|---|---|---|---|
| 5,842,115 A | 11/1998 | Dent | |
| 5,892,393 A * | 4/1999 | Yamashita | 327/545 |
| 5,960,346 A | 9/1999 | Holshouser | |
| 5,990,736 A * | 11/1999 | Nasuno et al. | 330/66 |
| 6,307,151 B1 | 10/2001 | Roberson | 174/35 |

(Continued)

OTHER PUBLICATIONS

"Hearing Aid Compatibility with Wireless Communications Devices", H. Stephen Berger, Siemens Business Communicaitons Systems.*

Berger, Stephen H. "Hearing Aid Compatibility with Wireless Communications Devices" *IEEE 1997 International Symposium on Electromagnetic Compatibility* pp. 123-128 (1997).

International Search Report and Written Opinion of the International Searching Authority for Application No. PCT/US2004/038140 mailed on Apr. 8, 2005.

Rich, Alan "Shielding and Guarding: How to Exclude Interference-Type Noise. What to Do and Why to Do it -A Rational Approach" *Analog Dialogue* 17(1): 1-6 (1983).

Mulvany et al.; "An analysis of Inductive Coupling and Interference Issues in Digital Wireless Phones" *Technical Solutions for Magnetic Interferencel* 1-6 (2006) <http://web.archive.org/web/20040226091626/http://shhh.org/html/accdigwire752a.html>.

(Continued)

*Primary Examiner*—Edward F. Urban
*Assistant Examiner*—Blane J. Jackson
(74) *Attorney, Agent, or Firm*—Myers, Bigel, Sibley & Sajovec, P.A.

(57) ABSTRACT

A wireless communications device can include a power amplifier that is configured to transmit information to a wireless communications network during a first time interval and configured to avoid transmitting information during a second time interval. A circuit substrate is coupled to the power amplifier and a power source is configured to provide power to the power amplifier. First and second conductor are coupled to the power amplifier and to the power source, and have respective overlapping and non-overlapping portions on the circuit substrate.

13 Claims, 4 Drawing Sheets

U.S. PATENT DOCUMENTS 6,396,000 B1 * 5/2002 Baum .......................... 174/261
6,423,909 B1 * 7/2002 Haynie et al. ............... 174/261
6,513,383 B1 * 2/2003 Okano et al. ............ 73/514.34
6,998,964 B2 * 2/2006 Lomax et al. ......... 340/310.11

OTHER PUBLICATIONS

FCC 03-0168, Section 68.4(a) Commission's Rules Governing Hearing Aid-Compatible Telephones (2003).

* cited by examiner

WIRELESS COMMUNICATIONS DEVICES INCLUDING CIRCUIT SUBSTRATES WITH PARTIALLY OVERLAPPING CONDUCTORS THEREON COUPLING POWER TO/FROM POWER AMPLIFIER SYSTEMS

FIELD OF THE INVENTION

The invention relates generally to the field of communication, and more particularly, to cellular radiotelephone communications.

BACKGROUND

It is known that hearing aids may operate in acoustic coupling mode or telecoil coupling mode. Hearing aids operating in acoustic coupling mode can receive and amplify sounds surrounding the user, both desired sounds, such as a telephone's audio signal, as well as unwanted ambient noise. Hearing aids operating in telecoil coupling mode may avoid unwanted ambient noise by turning off a hearing aid microphone and receiving only magnetic fields generated by telecoil-compatible telephones.

Although analog cellular radiotelephones do not generally cause interference problems for hearing aid users, digital cellular radiotelephones may cause interference with hearing aids and cochlear implants because of the electromagnetic energy emitted by some of the radiotelephone components. This interference can be significant enough to prevent individuals with hearing aids or cochlear implants from using digital cellular radiotelephones. In addition, some cellular radiophones may not provide the capability to inductively couple with hearing aids containing telecoils.

In particular, some digital cellular radiotelephone systems use Time Division Multiple Access (TDMA) techniques for communications, whereby a single radio frequency channel is shared between several calls by allocating different transmit and receive timeslots to different calls. Additionally, the transmit and receive timeslots in these TDMA systems are staggered so that the phone may not need to transmit and receive simultaneously so that the transmitter is inactive for a certain period during each frame.

The loss of transmission time (i.e., the inactive time of the transmitter) can be compensated for by buffering the digitized speech signal and subsequently transmitting the buffered signal at a higher rate than that at which it was buffered during its allocated slot. The transmitter power may be increased to support the higher rate. When such a transmitter is operated near sound reproducing equipment, such as a hearing aid, the switched operation of the transmitter may affect operation of the hearing aid. For example, the transmitter may induce an audible buzz in the audio generated by the hearing aid.

SUMMARY

Embodiments according to the invention can provide wireless communications devices including circuit substrates having partially overlapping conductors coupling power to/from power amplifier systems. Pursuant to these embodiments, a wireless communications device can include a power amplifier that is configured to transmit information to a wireless communications network during a first time interval and configured to avoid transmitting information during a second time interval. A circuit substrate is coupled to the power amplifier and a power source is configured to provide power to the power amplifier. First and second conductor are coupled to the power amplifier and to the power source, and have respective overlapping and non-overlapping portions on the circuit substrate.

In some embodiments according to the invention, the first and second conductors are first and second etch runs coupling the power source to the power amplifier. In some embodiments according to the invention, the circuit substrate is a printed circuit board or a flexible circuit board.

In some embodiments according to the invention, the first conductor is configured to conduct a first current in a first direction to the power amplifier and the second conductor is configured to accept a second current in a second direction, opposite the first direction, from the power amplifier. In some embodiments according to the invention, the first and second currents comprise first and second Direct Currents (DC) switched on/off at a frequency in a range between about 50 Hz and about 217 Hz responsive to operation of the power amplifier.

In some embodiments according to the invention, the respective over-lapping portion of the first conductor extends on a lower layer of the circuit substrate beneath the respective over-lapping portion of the second conductor on an upper layer of the circuit substrate. In some embodiments according to the invention, the respective over-lapping portions define about an orthogonal angle with one another. In some embodiments according to the invention, the overlapping and non-overlapping portions of the first conductor continuously extend on the lower layer and the overlapping and non-overlapping portions of the second conductor continuously extend on the upper layer.

In some embodiments according to the invention, the continuously extending first and second conductors define first and second partially overlapping zigzag patterns relative to one another. In some embodiments according to the invention, the overlapping and non-overlapping portions of the first and second conductors alternatingly extend between the lower layer and the upper layer. In some embodiments according to the invention, the alternatingly extending first and second conductors define first and second partially overlapping zigzag patterns relative to one another.

DESCRIPTION OF EMBODIMENTS ACCORDING TO THE INVENTION

The invention will now be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

In the drawings, the thickness of lines, layers and regions may be exaggerated for clarity. It will be understood that when an element, such as a layer, region or substrate, is referred to as being "on" another element, it can be directly on the other element or intervening elements may also be present. In contrast, when an element is referred to as being "directly on" another element, there are no intervening elements present. It will also be understood that, when an element is referred to as being "connected" or "coupled" to another element, it can be directly connected to the other element or intervening elements may be present. In contrast, when an element is referred to as being "directly connected" or "directly coupled" to another element, there are no intervening elements present. Like numbers refer to like elements throughout.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Well-known functions or constructions may not be described in detail for brevity and/or clarity. As used herein the expression "and/or" includes any and all combinations of one or more of the associated listed items.

As used herein, the term "wireless communications device" (or terminal) may include, but is not limited to, a cellular wireless terminal with or without a multi-line display; a Personal Communications System (PCS) terminal that may combine a cellular wireless terminal with data processing, facsimile and data communications capabilities; a PDA that can include a wireless terminal, pager, Internet/intranet access, Web browser, organizer, calendar and/or a global positioning system (GPS) receiver; and a conventional laptop and/or palmtop receiver or other appliance that includes a wireless terminal transceiver. Wireless terminals may also be referred to as "pervasive computing" devices and may be mobile terminals.

Wireless communications systems are commonly employed to provide voice and data communications to subscribers. For example, analog cellular radiotelephone systems, such as those designated AMPS, ETACS, NMT-450, and NMT-900, have long been deployed successfully throughout the world. Digital cellular radiotelephone systems, such as those conforming to the North American standard IS-54 and the European standard GSM, have been in service since the early 1990's. More recently, a wide variety of wireless digital services broadly labeled as PCS (Personal Communications Services) have been introduced, including advanced digital cellular systems conforming to standards such as IS-136 and IS-95, lower-power systems such as DECT (Digital Enhanced Cordless Telephone) and data communications services such as CDPD (Cellular Digital Packet Data).

Figure 1:
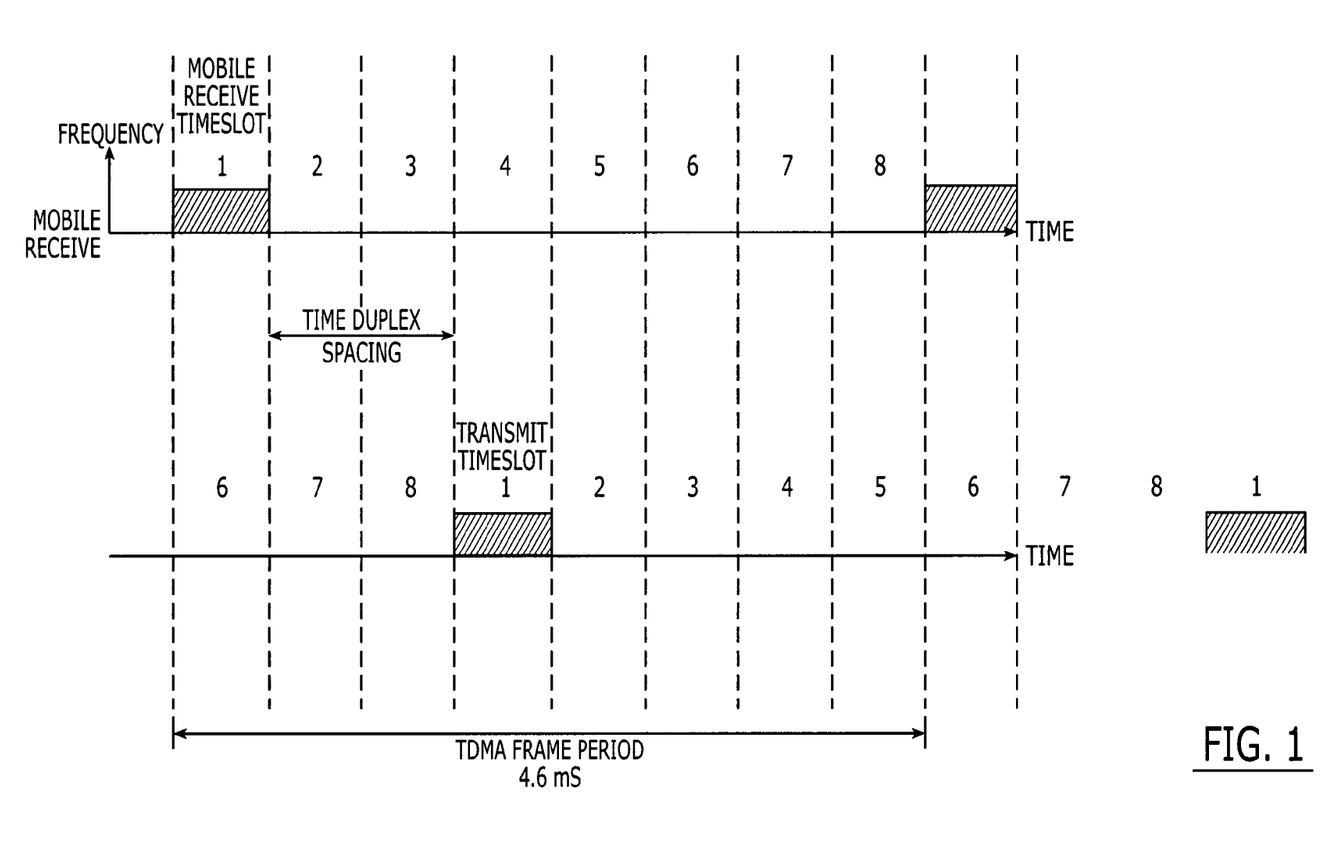
FIG. 1 is a schematic illustration of receive and transmit time slots in a TDMA type communications system.

FIG. 1 shows an example of the transmission format employed in the TDMA cellular system known as Global System for Mobile Communications (GSM). Therein, a repetitive frame period of approximately 4.6 ms is divided into eight timeslots (or 16 timeslots in the half-rate mode). Mobiles receive on a radio channel in a receive frequency band, each mobile receiving in an allocated one of the eight timeslots, e.g., timeslot 1 in FIG. 1. The mobile also transmits on a channel in the transmit frequency band in an allocated transmit timeslot, e.g., timeslot 1. Transmit timeslots are staggered in time relative to their corresponding receive timeslots so that the mobile phone does not have to transmit and receive at the same time. This is illustrated in the example of FIG. 1 as the time duplex spacing of two timeslots between timeslot 1 on the mobile receive frequency and timeslot 1 on the mobile transmit frequency. When different transmit and receive bands are employed, the base station may receive and transmit in all timeslots, and thus support eight conversations in the same transmit/receive channel pair. Otherwise, if no frequency-duplex spacing is employed, the base station can, for example, use four of the timeslots for transmission and four for reception, thus supporting four conversations in a single transmit/receive channel. In GSM, the remainder of the time not used by a particular mobile for transmission and reception is available for the mobile's receiver to scan other channels in order to determine, for example, when it should request a handover to a stronger base station. This process is known as mobile-assisted handover.

The transmit pulse formats are defined by the GSM specifications and include a guard time between pulses, an up/down-ramping time to turn the transmitter power smoothly on and off to avoid spectral splatter into unsynchronized adjacent channels, some guard bits at each end of the burst, and the main body of the TDMA burst which transmits 114 data bits, 26 sync bits and two control bits at a flat power level. The up/down-ramping times are adequate to prevent spectral spreading into an adjacent channel 200 KHz away.

Figure 2:
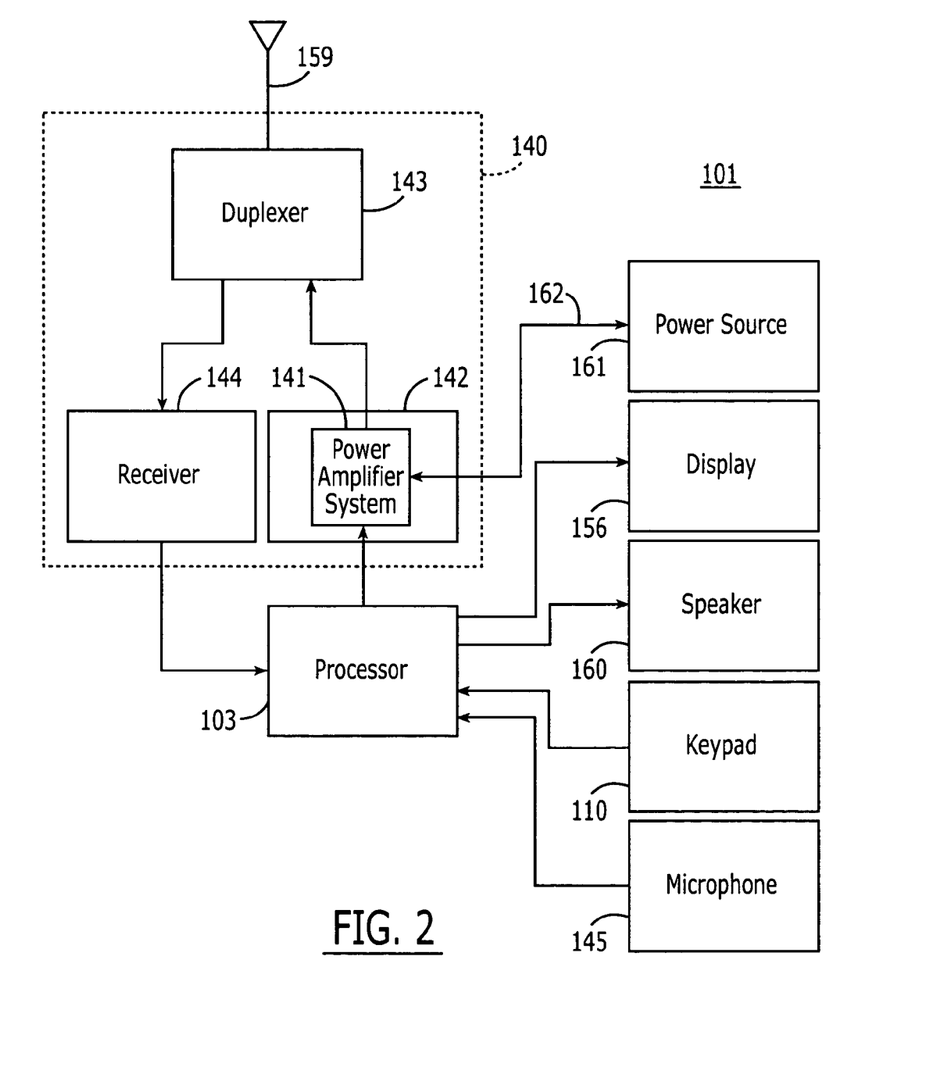
FIG. 2 is a block diagram that illustrates wireless communication devices according to some embodiments of the invention.

As shown in FIG. 2, the wireless communications device 101 configured to operate in the system shown in FIG. 1 includes a keypad 110 which can be used to provide input to the wireless communications device 101. The keypad 110 can include a plurality of keys that provide input to the wireless communications device 101 when pushed. For example, when the user wishes to initiate a call in the communications system, the user may push a series of keys that correspond to the number to be dialed. During the call, the user can speak into a microphone 145 which causes the wireless communications device 101 to generate communication signals which are transmitted from the wireless communications device 101. The user may listen to a speaker 160 that produces audio signals generated by the wireless communications device 101 from communication signals received by the wireless communications device 101 during a call. The wireless communications device 101 transmits and receives the communication signals via a transceiver 140 over an antenna 159.

During operation, the user may refer to a display 156 of the wireless communications device 101 to observe information relevant to the operation of the wireless communications device 101, such as characters or numbers. For example, the display 156 can be a black and white Liquid Crystal Display (LCD) that displays for example, a telephone number entered by the user or a name stored in the wireless communications device 101. The display 156 may also be used in conjunction with the keypad 110 such as when the user dials a number to place a call.

A processor 103 provides the communications signals to the transceiver 140 for transmission and receives the communications signals from the transceiver for reception. For example, the processor 103 provides communications signals to the transceiver 140 when the user speaks into the microphone 145 and receives communications signals from the transceiver 140 for the reproduction of audio through the speaker 160. The processor 103 can generate characters for display on the display 156. For example, the processor 103 can generate numbers for display when the user enters a telephone number on the keypad 110. The characters can also be generated by a character generator which is not shown. The microphone 145, speaker 160, keypad 110, and display 156 are coupled to the processor 103 which controls operations of the wireless communications device 101.

The transceiver 140 includes a transmitter 142 that includes a power amplifier system 141 that amplifies the transmit signals for transmission from the wireless communications device 101 through a duplexer 143 via the antenna 159 at a transmit frequency in a transmit frequency range. The duplexer 143 also provides communications signals received via the antenna 159 at a receive frequency in a receive frequency range to a receiver 144 which communicates with the processor 103. For example, in AMPS IS-19, the transmit frequency range is about 824 MHz to 849 MHz and the receive frequency range is about 869 MHz to 894 MHz as shown in FIG. 2. It will be understood that the transceiver 140 can include other components included in conventional transceivers which are not shown herein.

The duplexer 143 can include, for example, respective transmit and receive bandpass filters. The transmit bandpass filter can allow signals having a frequency in the transmit frequency range to be passed to the antenna 159 for transmission. The receive bandpass filter may allow signals having a frequency in the receive frequency range to be passed from the antenna 159 to the receiver 144. For example, in AMPS IS-19, the transmit bandpass filter passes signals having a frequency between about 824 MHz and 849 MHz (the transmit frequency range) to the antenna 159 for transmission and the receive bandpass filter passes signals having a frequency between about 869 MHz and 894 MHz from the antenna 159 to the receiver 144.

A power source 161 provides current to components of the wireless communications device 101. For example, the power source 161 provides current to and from the power amplifier system 141 via conductors 162. In operation, the power amplifier system 141 may be switched on and off as bursts of data are transmitted from the wireless communications device 101. For example, in D-AMPS TDMA, the power amplifier system 141 may be switched on and off 50 times per second whereas in GSM TDMA, the power amplifier system 141 may be switched on and off 217 times per second. Switching the power amplifier system 141 on (during transmit times) and off will cause direct current provided by the power source 161 to be drawn by the power amplifier system 141 and returned to the power source 161 in accordance with the frequency with which the power amplifier system 141 is switched. It will be understood that although one conductor 162 is shown in FIG. 2, first and second conductors may be used to provide current to and from the power amplifier system 141. In particular, a first conductor can be used to provide current from the power source 161 to the power amplifier system 141 whereas a second conductor may provide a return current path from the power amplifier system 141 to the power source 161. It will be understood that more than two conductors may be used.

It will be understood that all of the components shown in FIG. 2 may be mounted on a printed circuit board such as those that are used in conventional wireless communications devices. It will be further understood that the printed circuit board may be a multi-layered circuit board wherein conductive etches are formed on the different layers of the printed circuit board to conduct signals to and from components in the wireless communications device. The conductive etches may be used to provide the conductors 162 via which current is provided to/from the power amplifier system 141 from the power source 161. It will be further understood that the printed circuit board may be a flexible circuit board such as those commonly known in the art.

Figure 3:
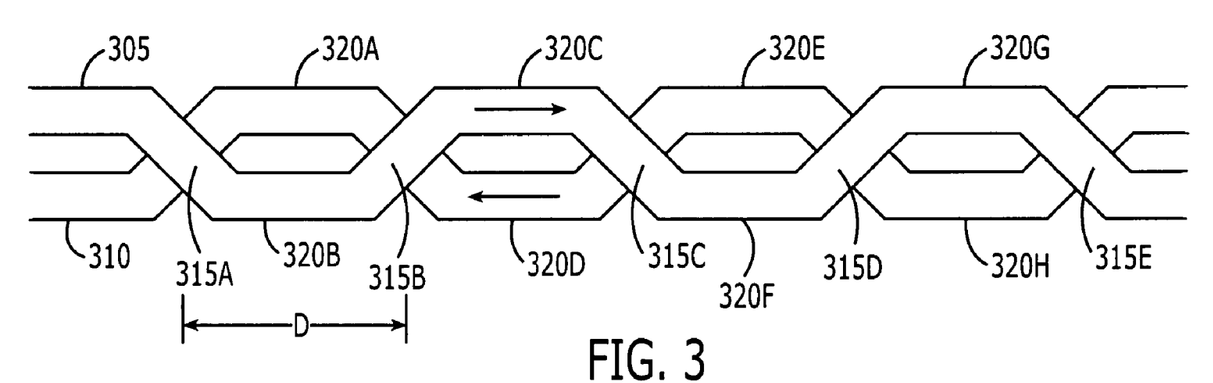
FIG. 3-6 are a schematic representations that illustrate first and second partially overlapping conductors according to some embodiments of the invention.

FIG. 3 is a plan view of first and second partially overlapping conductors that conduct current to/from a power amplifier system according to some embodiments of the invention. As shown in FIG. 3, a first conductor 305 continuously extends on a first layer of a printed circuit board in a zigzag pattern. A second conductor 310 continuously extends on a second layer of the printed circuit board that is beneath the first layer on which the first conductor 305 extends. Furthermore, the second conductor 310 also extends in a zigzag pattern to define overlapping and non-overlapping portions with the first conductor 305. In some embodiments according to the invention, overlapping portions of the first and second conductors 305, 310 include portions 315A-E of the first and second conductors 305, 310 which overlap one another to define substantially orthogonal angles relative to one another. It will be understood that, in some embodiments according to the invention, the overlapping portions of the first and second conductors 305, 310 may define non-orthogonal angles relative to one another. The zigzag patterns of the first and second conductors 305, 310 also include non-overlapping portions 320A-H.

The first and second conductors 305, 310 are coupled between the power source 161 and the power amplifier system 141. It will be understood that proximate to the power amplifier system 141 and the power source 161, the first and second conductors 305, 310 may diverge from one another to provide the appropriate connections to either the power amplifier system 141 or the power source 161. For example, the first conductor 305 may be connected to the power terminal of the power amplifier system 141 whereas the second conductor 310 may be connected to the reference (e.g., ground) terminal of the power amplifier system 141. Accordingly, the first and second conductors 305, 310 may not continuously extend proximate to the power amplifier system 141 to define the zigzag pattern shown in FIG. 3 for all portions thereof.

It will be understood that the first conductor 305 may be used to conduct a first current in a first direction, for example, from the power source 161 to the power amplifier system 141. Furthermore, it will be understood that the second conductor 310 may be used to conduct a second current in a second direction that is opposite the first direction from the power amplifier system 141 to the power source 161. Accordingly, the first and second currents are conducted in opposite directions so that the respective electromagnetic fields generated by the changes in the current in response to the switching of the power amplifier system 141 may mutually oppose one another to reduce an overall electromagnetic field generated by the switching of the power amplifier system 141. Therefore, the overall electromagnetic field generated by the switching of the power amplifier system 141 may be reduced so as to reduce interference with a hearing aid proximate to the wireless communications device 101.

It will be understood that although the first conductor 305 is described above as providing current to the power amplifier system, in other embodiments according to the invention, the first conductor 305 may be used to provide the return current path from the power amplifier system 141 to the power source 161. It will be further understood that the first and second layers on which the conductors are run, may be spaced adjacent to one another within the printed circuit board or may have other layers intervening therebetween.

The overlapping portions of the first and second conductors 305, 310 shown in FIG. 3 are spaced apart by a distance D. It will be understood, however, that spacing between immediately adjacent overlapping portions of the first and second conductors 305, 310 may be defined based on the frequency with which current to the power amplifier system 141 is switched. For example, if current is switched to the power amplifier system 141 at 50 Hz, the spacing between immediately adjacent overlapping portions of the first and second conductors can be a first value whereas the spacing between immediately adjacent overlapping portions of the first and second conductors 305, 310 may be another value when the power amplifier system 141 is switched at, for example, 217 Hz. Accordingly, the spacing between immediately adjacent overlapping portions of the first and second conductors 305, 310 can be based on the frequency with which the current is switched to the power amplifier system 141.

Figure 4:
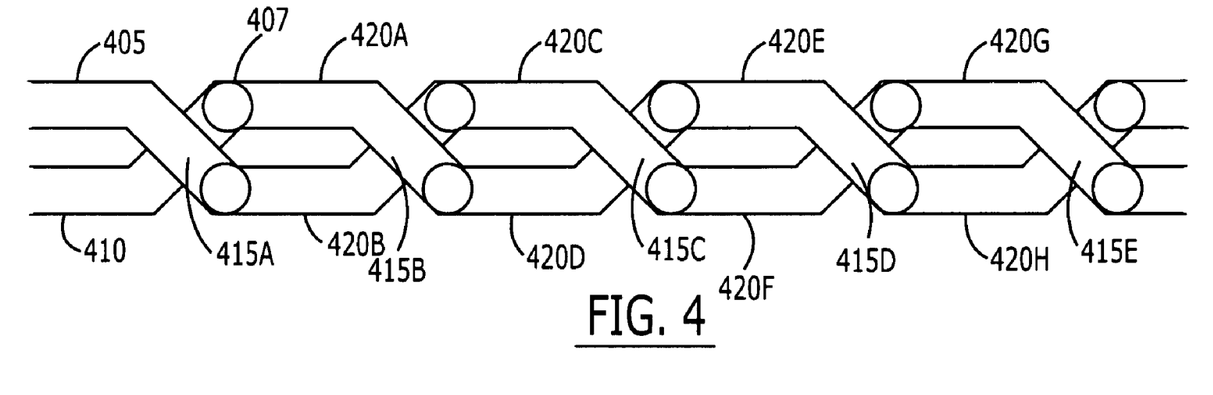

FIG. 4 is a plan view of first and second conductors having partially overlapping portions according to some embodiments of the invention. In particular, first and second conductors 405, 410 extend between the power amplifier system 141 and the power source 161. As shown in FIG. 4, the first illustrated portion of the first conductor 405 extends on a first layer of the printed circuit board whereas the first illustrated portion of the second conductor 410 extends on a second layer of the printed circuit board that is below the first layer. The first and second conductors 405, 410 overlap one another to define an overlapping portion 415A. In some embodiments according to the invention, overlapping portions overlap one another to define substantially orthogonal angles relative to one another. It will be understood that, in some embodiments according to the invention, the overlapping portions may define non-orthogonal angles relative to one another.

The first conductor 405 transitions from the first layer to the second layer whereas the second conductor 410 transitions from the second layer to the first layer at the non-overlapping portions 420A,B respectively. First and second conductors 405 and 410 again overlap at a second overlapping portion 415B whereas first and second conductors 405 and 410 each transition to the respective layer on which these conductors extended in the initially illustrated portion of FIG. 4. This pattern repeats so that the first and second conductors 405 and 410 alternately extend between the lower and upper layers to define the zigzag pattern shown in FIG. 4.

It will be understood that the transitions between the layers shown in FIG. 4 can be provided by circuit board conductive structures known to those skilled in the art. For example, the transitions 407 between the layers can be provided by conventional via or micro-via structures commonly used in printed circuit board technology. Other techniques and structures may be used as well. It will be further understood that the first and second conductors 405, 410 are configured to conduct current to/from the power amplifier system 141 so that the respective electromagnetic fields generated by the different currents are mutually opposing to reduce the overall electromagnetic field generated by the switching of the power amplifier system 141.

Figure 5:
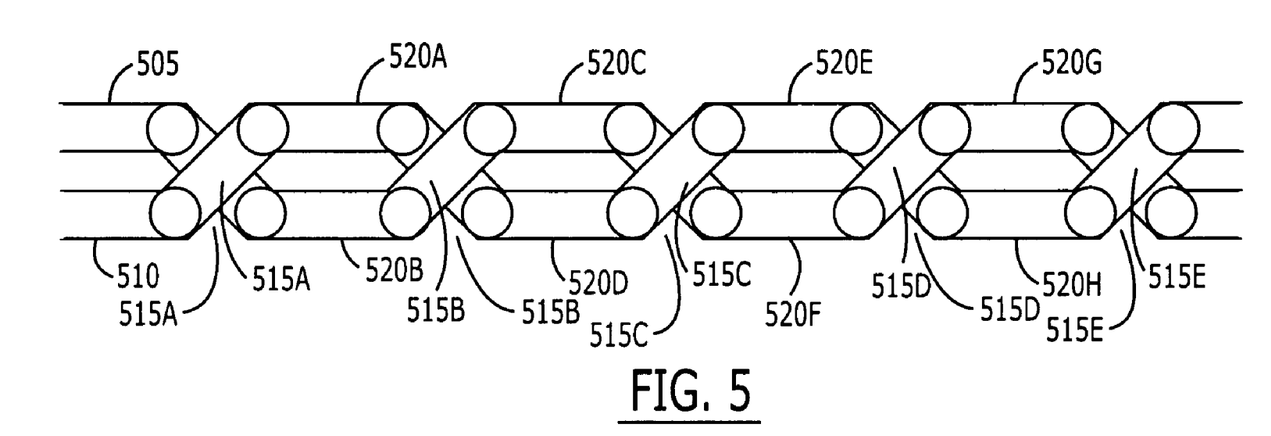

FIG. 5 is a plan view of first and second conductors having partially overlapping portions extending between a power source and a power amplifier system according to some embodiments of the invention. In particular, the first and second conductors 505, 510 in FIG. 5 define the overlapping portions by overlapping one another on the same layers of the printed circuit board as the conductors extend on the board. For example, the first overlapping portion 515A is defined by the first conductor 505 extending on the second layer of the printed circuit board whereas the second conductor 510 crosses the first conductor 505 on the first layer of the printed circuit board. The immediately adjacent overlapping portion 515B shows that the first conductor 505 again crosses the second conductor 510 on the second layer whereas the second conductor 510 again crosses the first conductor 505 on the first layer of the printed circuit board.

This pattern repeats continuously between the power amplifier system 141 and the power source 161. Similar to the other embodiments illustrated herein, the first and second conductors are configured to conduct first and second opposing currents so that the respective electromagnetic fields generated are mutually opposed to one another to reduce the overall electromagnetic field generated by the switching of the power amplifier system 141. In some embodiments according to the invention, overlapping portions overlap one another to define substantially orthogonal angles relative to one another. It will be understood that, in some embodiments according to the invention, the overlapping portions may define non-orthogonal angles relative to one another.

Figure 6:
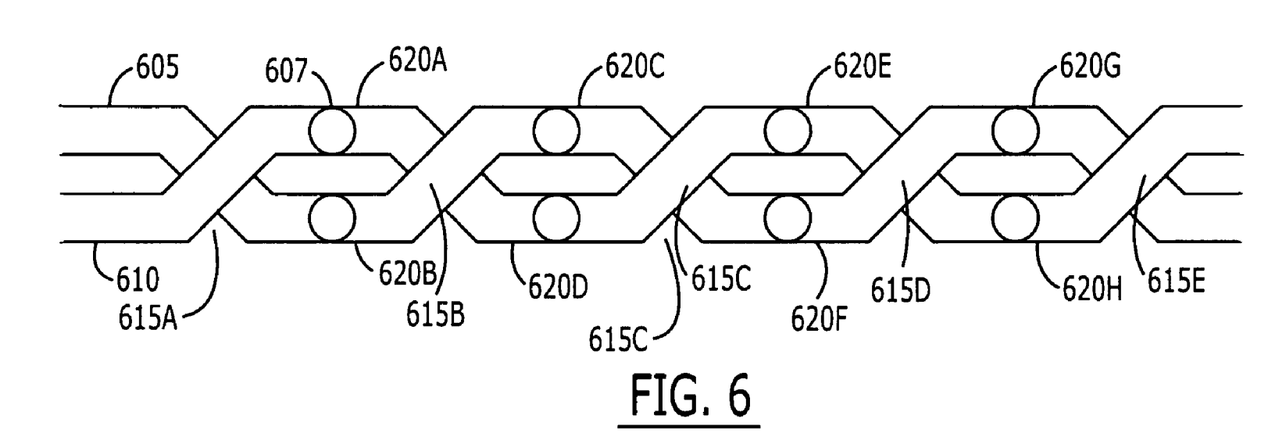

FIG. 6 is a plan view of first and second conductors having overlapping and non-overlapping portions according to some embodiments of the invention. As shown in FIG. 6, first and second conductors 605, 610 define overlapping portions 615A-E. The first and second conductors 605, 610 cross one another in an alternatingly over/under pattern. For example, the first conductor 605 crosses over the second conductor 610 on the first layer of the printed circuit board whereas the second conductor 610 overlaps the first conductor 605 on the second layer of the printed circuit board at the first overlapping portion 615A. The immediately adjacent overlapping portion 615B is defined by the first conductor 605 extending on the second layer of the printed circuit board whereas the second conductor 610 extends above the first conductor 605 on the first layer of the printed circuit board.

This alternating pattern repeats as the first and second conductors extend between the power amplifier system 141 and the power source 161. As shown in FIG. 6, the first and second conductors 605 and 610 transition between the first and second layers of the printed circuit board by conductors 607 located within non-overlapping portions 620A-H thereof. In some embodiments according to the invention, overlapping portions overlap one another to define substantially orthogonal angles relative to one another. It will be understood that, in some embodiments according to the invention, the overlapping portions may define non-orthogonal angles relative to one another.

It will be understood that although separate embodiments have been shown in FIGS. 2-6 of the present disclosure, other embodiments may also be provided by combining various aspects of the separately illustrated embodiments. Furthermore, spacing between immediately adjacent overlapping portions may be varied as the first and second conductors extend between the power amplifier system 141 and the power source 161. For example, the overlapping portions of the first and second conductors may be spaced at a first interval close to the power amplifier system 141 and may be spaced at a greater interval as a first and second conductors approach the power source 161. Embodiments may also be provided with reversed spacing intervals described above. It will also be understood that the spacing between overlapping portions may be continuously varied as the conductors extend on the substrate.

For ease of illustration the present invention has been described in terms of communication with a Global System for Mobile Communication (GSM) network. The present invention may be practiced in any wireless or cellular telecommunication network, including but not limited to TDMA systems, code division multiple access (CDMA) systems, cordless telephone devices, wireless PBX systems, or other like wireless systems or protocols. A mobile station, as disclosed in this specification, may be a wireless device such as a cellular or cordless telephone, or may be a type of audio playback device such as recording or amplification equipment connected to the hearing aid via an ad hoc piconet.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. A wireless communications device comprising:
   a power amplifier configured to transmit information to a wireless communications network during a first time interval and configured to avoid transmitting information during a second time interval;
   a circuit substrate coupled to the power amplifier;
   a power source configured to provide power to the power amplifier; and
   first and second conductors, coupled to the power amplifier and to the power source, having respective overlapping and non-overlapping portions on the circuit substrate;
   wherein the first conductor is configured to conduct a first current in a first direction to the power amplifier and the second conductor is configured to accept a second current in a second direction, opposite the first direction, from the power amplifier, wherein the first and second currents comprise first and second Direct Currents (DC) switched on/off at a frequency in a range between about 50 Hz and about 217 Hz responsive to operation of the power amplifier.

2. A wireless communications device according to claim 1 wherein the first and second conductors comprise first and second etch runs coupling the power source to the power amplifier.

3. A wireless communications device according to claim 1 wherein the circuit substrate comprises a printed circuit board or a flexible circuit board.

4. A wireless communications device comprising:
   a power amplifier configured to transmit information to a wireless communications network during a first time interval and configured to avoid transmitting information during a second time interval;
   a circuit substrate coupled to the power amplifier;
   a power source configured to provide power to the power amplifier; and
   first and second conductors, coupled to the power amplifier and to the power source, having respective overlapping and non-overlapping portions on the circuit substrate;
   wherein the respective over-lapping portion of the first conductor extends on a lower layer of the circuit substrate beneath the respective over-lapping portion of the second conductor on an upper layer of the circuit substrate, wherein the respective over-lapping portions define about an orthogonal angle with one another.

5. A wireless communications device according to claim 4 wherein the overlapping and non-overlapping portions of the first conductor continuously extend on the lower layer and the overlapping and non-overlapping portions of the second conductor continuously extend on the upper layer.

6. A wireless communications device according to claim 5 wherein the continuously extending first and second conductors define first and second partially overlapping zigzag patterns relative to one another.

7. A wireless communications device according to claim 5 wherein the alternatingly extending first and second conductors define first and second partially overlapping zigzag patterns relative to one another.

8. A wireless communications device according to claim 4 wherein the overlapping and non-overlapping portions of the first and second conductors alternatingly extend between the lower layer and the upper layer.

9. A wireless communications device according to claim 4 wherein the lower layer and the upper layer comprise layers that are either separated by one or more other layers or are immediately adjacent layers.

10. A wireless communications device comprising:
    a power amplifier configured to transmit information to a wireless communications network during a first time interval and configured to avoid transmitting information during a second time interval;
    a circuit substrate coupled to the power amplifier;
    a power source configured to provide power to the power amplifier; and
    first and second conductors, coupled to the power amplifier and to the power source, having respective overlapping and non-overlapping portions on the circuit substrate, wherein a spacing between immediately adjacent overlapping portions of the first and second conductors is based on a frequency with which current to the power amplifier is switched.

11. A wireless communications device comprising:
    a power amplifier configured to transmit information to a wireless communications network during a first time interval and configured to avoid transmitting information during a second time interval;
    a circuit substrate coupled to the power amplifier;
    a power source configured to provide power to the power amplifier; and
    first and second conductors on the substrate, coupled to the power amplifier and to the power source, continuously extending on lower and upper layers of the circuit substrate respectively to define first and second partially overlapping zigzag patterns relative to one another, wherein a spacing between immediately adjacent overlapping portions of the first and second conductors is based on a frequency with which current to the power amplifier is switched.

12. A wireless communications device according to claim 11 wherein the first conductor is configured to conduct a first current in a first direction to the power amplifier and the second conductor is configured to accept a second current in a second direction, opposite the first direction, from the power amplifier.

13. A wireless communications device according to claim 12 wherein the first and second currents comprise first and second Direct Currents (DC) switched on/off at a frequency in a range between about 50 Hz and about 217 Hz responsive to operation of the power amplifier.

* * * * *